(12) United States Patent
Jow et al.

(10) Patent No.: US 9,865,561 B2
(45) Date of Patent: Jan. 9, 2018

(54) ELECTRONIC PACKAGE HAVING A SUPPORTING BOARD AND PACKAGE CARRIER THEREOF

(71) Applicant: ADL ENGINEERING INC., Hsin-Chu (TW)

(72) Inventors: En-Min Jow, Hsin-Chu (TW); Cheng-Yu Kang, Hsin-Chu (TW)

(73) Assignee: ADL ENGINEERING INC., Hsin-Chu (TW)

( * ) Notice: Subject to any disclaimer, the term of this patent is extended or adjusted under 35 U.S.C. 154(b) by 0 days.

(21) Appl. No.: 15/424,878

(22) Filed: Feb. 5, 2017

(65) Prior Publication Data

US 2017/0170138 A1 Jun. 15, 2017

Related U.S. Application Data

(63) Continuation of application No. 14/562,566, filed on Dec. 5, 2014, now Pat. No. 9,603,246.

(Continued)

(51) Int. Cl.
*H01L 23/00* (2006.01)
*H01L 23/31* (2006.01)
(Continued)

(52) U.S. Cl.
CPC .......... *H01L 24/73* (2013.01); *H01L 21/4853* (2013.01); *H01L 23/145* (2013.01); *H01L 23/3121* (2013.01); *H01L 23/49822* (2013.01); *H01L 24/29* (2013.01); *H01L 24/48* (2013.01); *H01L 24/97* (2013.01); *H05K 1/111* (2013.01); *H01L 21/4842* (2013.01); *H01L 21/561* (2013.01); *H01L 21/568* (2013.01); *H01L 24/16* (2013.01); *H01L 24/32* (2013.01); *H01L 2224/16225* (2013.01);
(Continued)

(58) Field of Classification Search
CPC ......... H01L 24/73; H01L 24/29; H01L 24/48; H01L 23/3121; H01L 23/49822; H01L 2224/2929; H01L 2224/29339; H01L 2224/48091; H01L 2224/49; H01L 2224/73265; H05K 1/111
See application file for complete search history.

(56) References Cited

U.S. PATENT DOCUMENTS 5,172,213 A * 12/1992 Zimmerman ....... H01L 23/4334
165/80.2
5,547,730 A * 8/1996 Weiblen ................. H01L 23/24
174/565

(Continued)

*Primary Examiner* — Benjamin Sandvik
*Assistant Examiner* — Gustavo Ramallo
(74) *Attorney, Agent, or Firm* — Chieh-Mei Wang

(57) ABSTRACT

A package carrier is provided. The package carrier includes a wiring layer and an insulating pattern. The wiring layer includes at least one connecting pad and at least one mounting pad. The mounting pad is used for mounting an electronic component, and the connecting pad is used for electrically connecting the electronic component. The insulating pattern is stacked on and connected to the wiring layer. A boundary surface is formed between the wiring layer and the insulating pattern. Both of the wiring layer and the insulating pattern do not extend over the boundary surface. In addition, an electronic package including the package carrier is also provided.

6 Claims, 12 Drawing Sheets

Related U.S. Application Data

(60) Provisional application No. 61/939,306, filed on Feb. 13, 2014, provisional application No. 61/913,423, filed on Dec. 9, 2013.

(51) Int. Cl.
    *H05K 1/11*     (2006.01)
    *H01L 23/14*     (2006.01)
    *H01L 23/498*     (2006.01)
    *H01L 21/56*     (2006.01)
    *H01L 21/48*     (2006.01)

(52) U.S. Cl.
    CPC ............... *H01L 2224/2929* (2013.01); *H01L 2224/29339* (2013.01); *H01L 2224/48091* (2013.01); *H01L 2224/49* (2013.01); *H01L 2224/73265* (2013.01); *H01L 2924/00014* (2013.01); *H01L 2924/12042* (2013.01); *H01L 2924/181* (2013.01)

(56) References Cited

U.S. PATENT DOCUMENTS

2010/0096163 A1*   4/2010   Sakaguchi ............ H01L 21/486
                                                                              174/252
2013/0194815 A1*   8/2013   Gershowitz ............ F21V 21/00
                                                                              362/382

* cited by examiner

ELECTRONIC PACKAGE HAVING A SUPPORTING BOARD AND PACKAGE CARRIER THEREOF

CROSS-REFERENCES

This is a Continuation Application of U.S. application Ser. No. 14/562,566 (filed on Dec. 5, 2014), which is based upon and claims the benefit of priority from provisional applications No. 61/913,423 (filed on Dec. 9, 2013) and No. 61/939,306 (filed on Feb. 13, 2014). The entirety of the above-mentioned patent applications are hereby incorporated by reference herein and made a part of this specification.

FIELD OF THE INVENTION

The present invention relates to an electronic package and a package carrier.

BACKGROUND OF THE INVENTION

During the general process of manufacturing semiconductor devices, after the microminiaturized circuitry is fabricated on the wafer, the wafer is diced to into a plurality of dies. Subsequently, the dies are packaged and respectively mounted on the package carriers to form a plurality of electronic packages. In general, the above mentioned carrier platform has a similar structure to the printed wire board. That is, the package carrier usually includes at least two wiring layers and at least one core layer interposed therebetween, and the core layer may be a cured prepreg. Accordingly, the conventional electronic package includes at least two wiring layers and at least one insulating layer (core layer) besides the die.

SUMMARY OF THE INVENTION

The object of the present invention is to provide a package carrier, which is capable of mounting at least one electronic component.

The object of the present invention is to provide an electronic package including the abovementioned package carrier.

In order to achieve the aforementioned objects, according to an embodiment of the present invention, a package carrier is provided. The package carrier includes a wiring layer and an insulating pattern. The wiring layer includes at least one connecting pad and at least one mounting pad. The mounting pad is used for mounting an electronic component, and the connecting pad is used for electrically connecting the electronic component. The insulating pattern is stacked on and connected to the wiring layer. A boundary surface is formed between the wiring layer and the insulating pattern. Both of the wiring layer and the insulating pattern do not extend over the boundary surface.

According to an embodiment of the present invention, an electronic package is provided. The electronic package includes the abovementioned carrier package, an electronic component and a molding layer. The electronic component is mounted on the mounting pad and electrically connected to at least one connecting pad. The wiring layer is configured between the electronic component and the insulating pattern. The molding layer covers the wiring layer and the electronic component.

Accordingly, the holding substrate and the supporting board are used in the present invention to manufacture the package carrier. The package carrier and electronic package without the core layer can be fabricated by the manufacturing method, which is distinguishable over the conventional technique.

In order to further the understanding regarding the present invention, the following embodiments are provided along with illustrations to facilitate the disclosure of the present invention.

DETAILED DESCRIPTION OF PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1A:
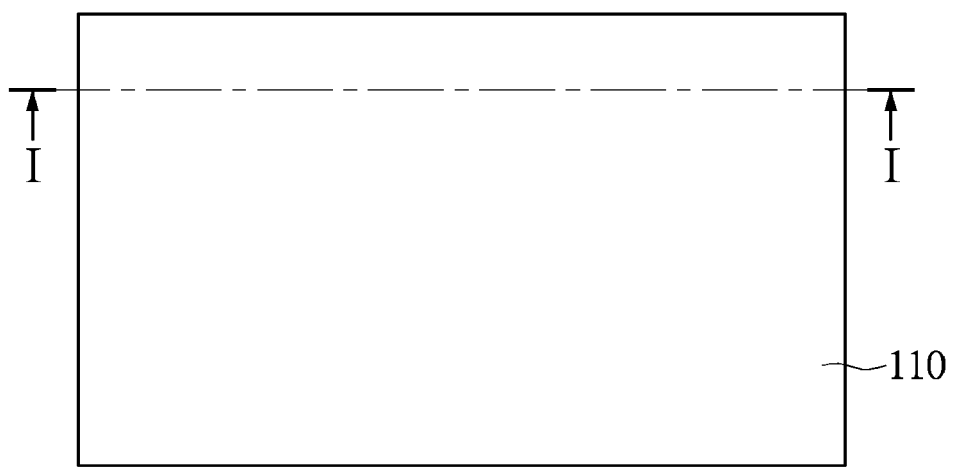
FIG. 1A to FIG. 3E respectively show sectional views of the package carrier in different steps of the manufacturing method provided in accordance with an embodiment of the present invention.
Figure 1B:
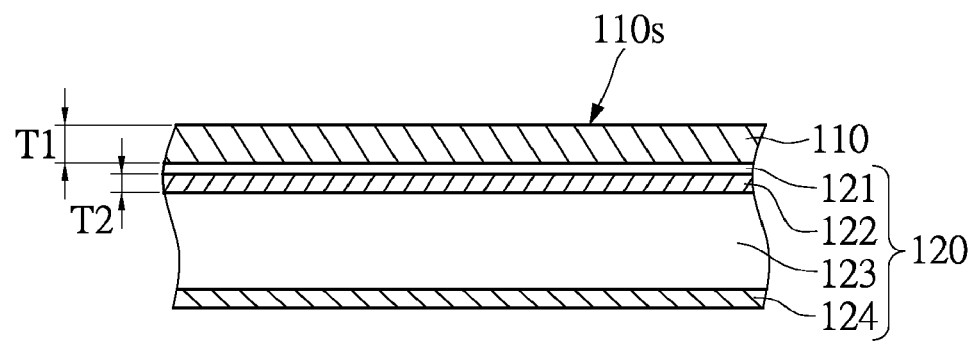

FIG. 1A to FIG. 3E respectively show sectional views of the package carrier in different steps of the manufacturing method provided in accordance with an embodiment of the present invention. FIG. 1A to FIG. 1C show the formation of the insulating pattern on the conductive layer. Please refer to FIG. 1A and FIG. 1B. FIG. 1B is a sectional view taken along a line I-I in FIG. 1A. In the method of manufacturing the package carrier according to the instant embodiment, a conductive layer 110 and a holding substrate 120 are provided. The conductive layer 110 is stacked on the holding substrate 120 and can be made of metal foil, such as a copper foil, a silver foil, an aluminum foil or an alloy foil.

The holding substrate 120 includes a main plate (not labeled) and a release layer 121, and the release layer 121 is interposed between the conductive layer 110 and the main plate. The main plate can be a ceramic plate, a metal plate, or a composite plate made of different kinds of materials. In the embodiment shown in FIG. 1B, the main plate is a composite plate and has multilayers. Specifically, the main plate includes a dielectric layer 123, two metal layers 122 and 124. The dielectric layer 123 is interposed between the two metal layers 122 and 124, and the release layer 121 is interposed between the metal layer 122 and the conductive layer 110.

The main plate can be a copper clad laminate (CCL), and the conductive layer 110 can be a metal foil, such as a copper foil, a silver foil, an aluminum foil, or an alloy foil. The dielectric layer 123 can be a cured prepreg, a resin layer and a ceramic layer. In addition, in the instant embodiment, the thickness T1 of the conductive layer 110 is larger than the thickness T2 of the metal layer 122. For example, the conductive layer 110 can be a copper foil having a thickness of 18 μm, and the metal layer 122 can be a copper foil having a thickness of 3 μm.

The conductive layer 110 can be connected to the holding substrate 120 through the release layer 121. However, the conductive layer 110 is adhered to the release layer 121 with a weak adhesion force so that the conductive layer 110 is easily separated from the release layer 121 when an enough external force is applied to the conductive layer 110. For example, the conductive layer 110 can be peeled off from the release layer 121 by hand. Additionally, the release layer 121 can be a metal sheet, such as an alloy sheet, or a polymer film.

Figure 1C:
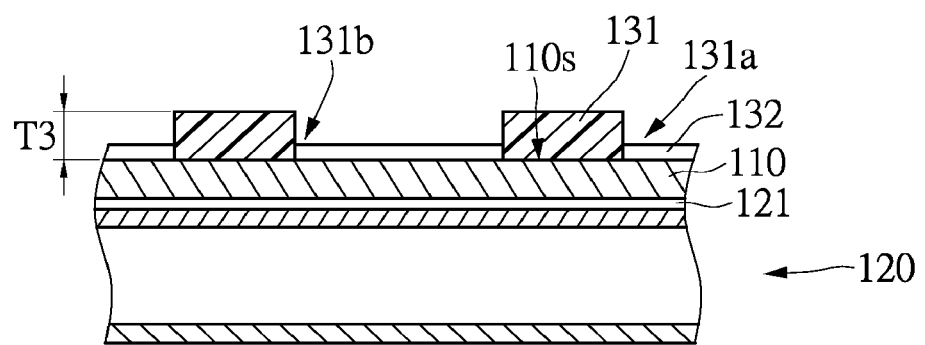

Please refer to FIG. 1C. Subsequently, an insulating pattern 131 is formed on the conductive layer 110. The insulating pattern 131 has a thickness T3 ranging from 10 to 50 μm. The insulating pattern 131 locally covers the surface 110s of the conductive layer 110, and exposes a portion of the conductive layer 110. Furthermore, the insulating pattern 131 has at least one opening formed therein. Taking FIG. 1C as an example, the insulating pattern 131 has two openings 131a and 131b, both of which extend to the surface 110s. The insulating pattern 131 can be a solder mask layer, such as a wet film solder mask or a dry film solder mask. In addition, the insulating pattern 131 may be formed by inkjet printing or lamination. Furthermore, the solder mask may be photosensitive, and openings 131a and 131b may be formed by exposure and development.

After the insulating pattern 131 is formed, a bonding material 132 is formed on the surface 110s of the conductive layer 110 which is exposed by the insulating pattern 131. The bonding material 132 can be a solder layer, metallic layer or organic solderability preservatives (OSP) layer. The solder is, for example, tin paste, silver glue or copper paste, and the metallic layer is, for example, a nickel layer, a gold layer, a silver layer, a palladium layer, a Ni/Au layer, or a Ni/Pd/Au layer, in which both the Ni/Au layer and the Ni/Pd/Au layer are multilayer films.

The solder may be formed by applying or dispensing, and the metallic layer may be formed by deposition, such as chemical vapor deposition (CVD), physical vapor deposition (PVD), electroplating or electroless plating. The physical vapor deposition is, for example, evaporation or sputtering. The OSP layer may be formed by dipping.

Figure 2A:
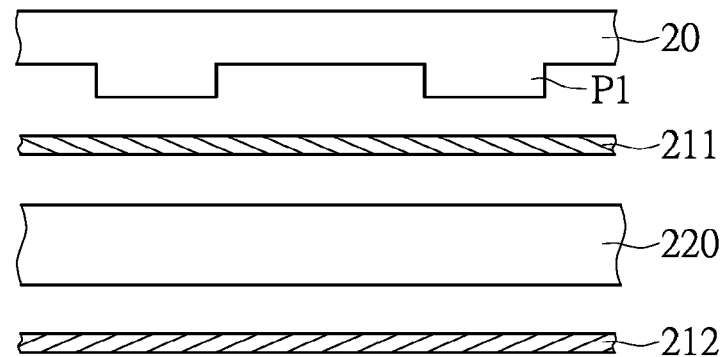
Figure 2B:
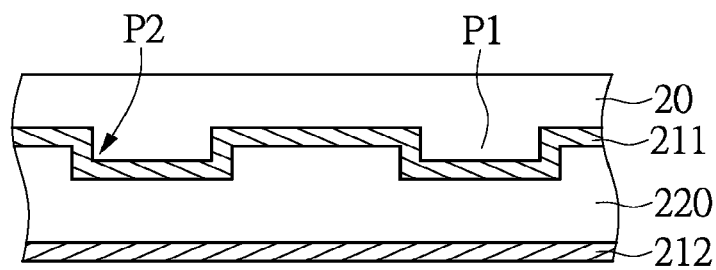
Figure 2C:
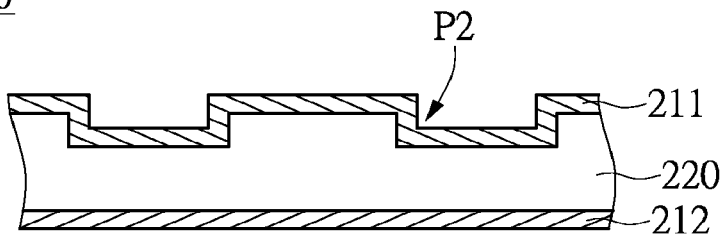

FIG. 2A to FIG. 2C illustrate the cross-section views of the supporting board 200 (please refer to FIG. 2C) provided in the method of manufacturing the package carrier according to the instant embodiment, and further illustrate the method of fabricating the supporting board 200. Please refer to FIG. 2A and FIG. 2B. In the method of fabricating the supporting board 200, first, an imprint template 20 having an imprinting pattern P1 is provided. Subsequently, the metal layer 211 is laminated with a plastic board 220 by using the imprint template 20 so that the metal layer 211 is bonded to the plastic board 220, and the imprinting pattern P1 is transferred into the metal layer 211 to form a depression pattern P2.

The plastic board 220 has thermosetting property. Before the metal layer 211 is laminated with the plastic board 220, the plastic board 220 is a prepreg in semi-cured state, i.e., the B-stage prepreg. As such, while the metal layer 211 is being laminated on the plastic board 220, a thermal process is performed to cure the plastic board 220.

Additionally, another metal layer 212 and the metal layer 211 can be laminated on the plastic board 220 during the same lamination process, and the plastic board 220 is interposed between the two metal layers 211 and 212. The metal layers 211 and 212 can be made of metal foil, such as cooper foil, silver foil or alloy foil. However, in another embodiment, the plastic board 220 is laminated with only one metal layer 211, and the metal layer 212 or the other metal layers are omitted.

Please refer to FIG. 2B and FIG. 2C. After the metal layers 211 and 212 are laminated with the plastic board 220, the imprint template 20 is removed to expose the metal layer 211 having the depression pattern P2. At this time, the fabrication of the supporting board 200 including the plastic board 220 and two metal layers 211 and 212 has been substantially completed. The depression pattern P2 is aligned to the insulating pattern 131 to accommodate the insulating pattern 131. In addition, in the instant embodiment, a portion of the imprinting pattern P1 or the whole imprinting pattern P1 can be the same as the insulating pattern 131.

Notably, the supporting board 200 illustrated in FIG. 2A to FIG. 2C is a composite board having a multilayered structure and including the plastic board 220 and two metal layers 211 and 212. However, in another embodiment, the supporting board 200 may be a ceramic board, a metal board, a thermoplastic board, or a composite board without the multilayered structure. The thermoplastic board is, for example, a polymethacrylate board, i.e., an acrylic board. The metal board can be made of a single metal material or an alloy material. Thus, the supporting board 200 is not limited to the composite board as shown in FIG. 2C.

Figure 3A:
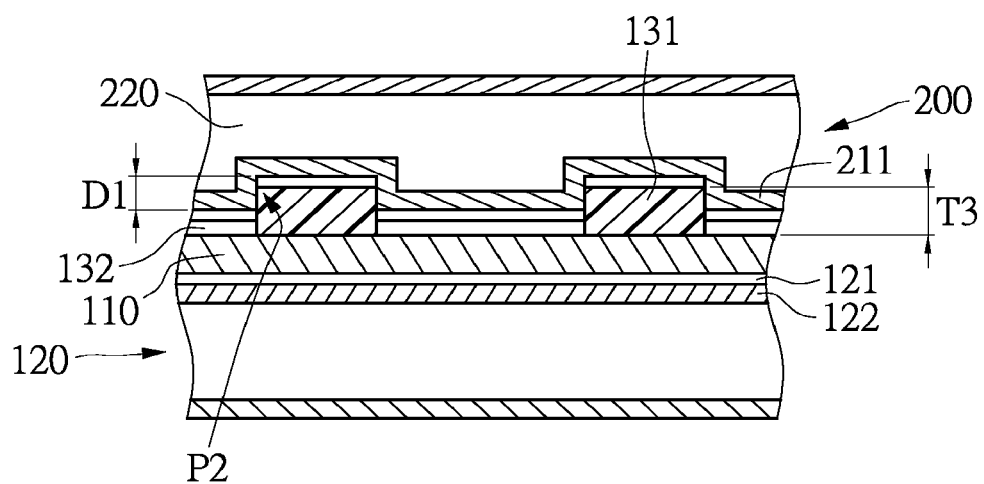

FIG. 3A to FIG. 3D show the method of manufacturing the wiring layer of the package carrier according to the instant embodiment. Please refer to FIG. 3A. The supporting board 200 shown in FIG. 3A is flipped in comparison with the supporting board 200 shown in FIG. 2C. After the fabrication of the supporting board 200, the insulating pattern 131 is fixed in the depression pattern P2 so that the conductive layer 110, the holding substrate 120, the insulating pattern 131 and the supporting board 200 are integrated to one. Meanwhile, the metal layer 211 is interposed between the insulating pattern 131 and the plastic board 220, as shown in FIG. 3A.

In the instant embodiment, the step of fixing the insulating pattern 131 in the depression pattern P2 can include fitting the insulating pattern 131 into the depression pattern P2. Specifically, the supporting board 200 is pressed in the insulating pattern 131. Because the depression pattern P2 is aligned to the insulating pattern 131 and capable of accommodating the insulating pattern 131, the insulating pattern 131 is fitted in the depression pattern P2 after the supporting board 200 is pressed into insulating pattern 131.

A suitable tolerance between the insulating pattern 131 and the depression pattern P2 can be designed so that the insulating pattern 131 can be in contact with the sidewall of the depression pattern P2 after the insulating pattern 131 is fitted within the depression pattern P2. As such, enough friction force is generated to prevent the insulating pattern 131 and the depression pattern P2 from being easily separated from each other. Accordingly, the insulating pattern 131 can be detachably fixed in the depression pattern P2. In addition, the thickness T3 of the insulating pattern 131 can be greater than or equal to a depth D1 of the depression pattern P2. In another case, the thickness T3 can be less than the depth D1 of the depression pattern P2.

The abovementioned step of pressing the insulating pattern 131 into the depression pattern P2 is performed under vacuum, in which a negative pressure can be generated in the depression pattern P2 so that the external atmospheric pressure is applied to the supporting board 200 and the conductive layer 110. As such, the connection between the supporting board 200 and the conductive layer 110 can be enforced so that the supporting board 200 does not easily drop off from the insulating pattern 131. However, notably, the insulating pattern 131 can be detachably fixed in the depression pattern P2 by adhering.

For example, during the step of pressing, both the supporting board 200 and the insulating pattern 131 can be heated to soften the insulating pattern 131 and generate adhesive ability. As such, the insulating pattern 131 is capable of adhering to the supporting board 200 and fixed in the depression pattern P2. In addition, besides the insulating pattern 131, the other adhesive materials can be used to adhere the supporting board 200 to the insulating pattern 131. The adhesive material can be a reusable pressure sensitive adhesive, such as a rubber-based pressure sensitive adhesive, acrylic-based pressure sensitive adhesive or silicone resin-based pressure sensitive adhesive. In addition, the adhesive material may be made of silicone resin, rubber, polydimethylsiloxane (PDMS), polymethylmethacrylate (PMMA, or acrylic) or resin.

Figure 3B:
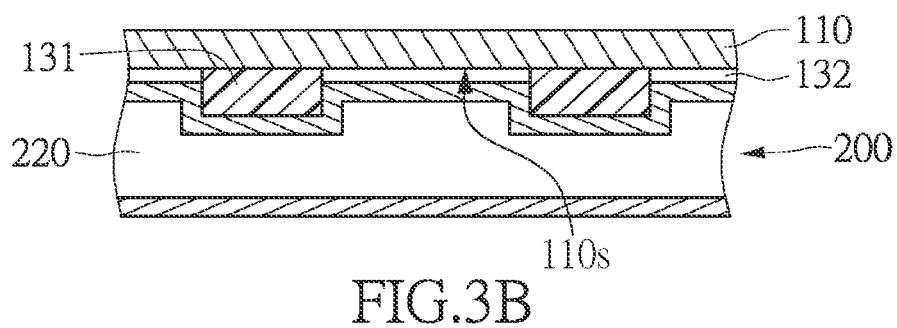

Please refer to FIG. 3A and FIG. 3B. After the insulating pattern 131 is detachably fixed in the depression pattern P2, the holding substrate 120 is removed and the conductive layer 110 remains on the supporting board 200 without being covered. There are many ways of removing the holding substrate 120. In the instant embodiment, the holding substrate 120 can be removed from the conductive layer 110 by peeling off the release layer 121, which can be performed by hand or machine. In addition, in another embodiment, when the holding substrate 120 is a metal substrate, the holding substrate 120 can be removed by an etching process. Accordingly, the means of removing the holding substrate 120 is not limited to peeling.

Figure 3C:
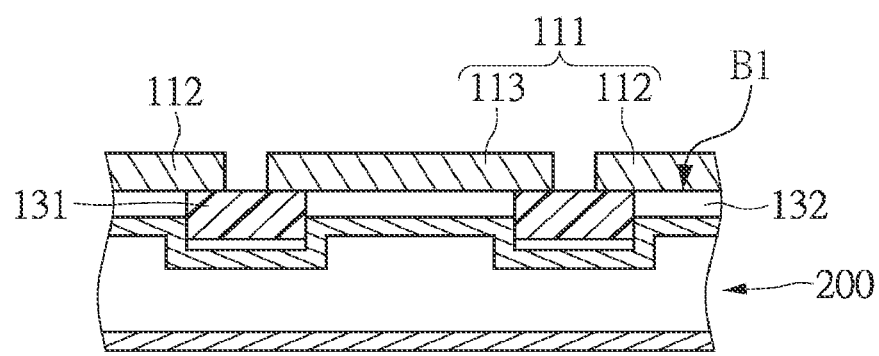

Please refer to FIG. 3B and FIG. 3C. Subsequently, the conductive layer 110 is patterned to form a wiring layer 111. The wiring layer 111 can be formed by photolithography and etching. That is, the wiring layer 111 can be formed by removing a part of the conductive layer 110, so that the surface 110s forms a boundary surface B1 between the wiring layer 111 and the insulating pattern 131 after patterning the conductive layer 110. Accordingly, both of the wiring layer 111 and the insulating pattern 131 do not extend over the boundary surface B1.

The wiring layer 111 includes at least one connecting pad 112 and at least one mounting pad 113. The mounting pad 113 is used for mounting an electronic component 410 (please refer to FIG. 4B), and the connecting pad 112 is used for electrically connecting the electronic component 410. Additionally, only one mounting pad 113 and two connecting pads 112 are shown in FIG. 3C. In another embodiment, the number of the mounting pads 113 may be a plurality, and the number of the connecting pads 112 may be one, three or larger than three. Accordingly, both the numbers of the mounting pads 113 and the connecting pads 112 are not limited to the number shown in FIG. 3C.

Figure 3D:
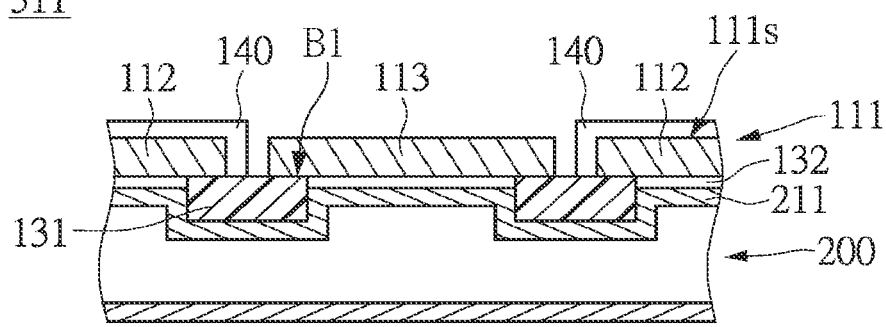

Please refer to FIG. 3D. After the formation of the wiring layer 111, the surface roughness of the wiring layer 111 can be changed. Specifically, according to the demands of the product, a surface treatment, such as roughening or polishing treatment, is performed on the surface 111s of the wiring layer 111 so that the roughness of the surface 111s satisfies the demands of the product. The roughening treatment can be a black oxide treatment or a brown oxide treatment, which are usually applied in the manufacturing processes of printed circuit boards (PCB). After the roughening treatment is performed on the wiring layer 111, a rough oxide layer, such as a copper oxide layer, is formed on the surface 111s. As such, the surface roughness of the surface 111s can be increased.

The polishing treatment can be a brushing or electropolishing treatment. After the conductive layer 110 is polished, the surface roughness of the surface 110s is decreased. In addition, a rough oxide layer, such as a copper oxide layer, can be pre-formed on the surface 111s of the wiring layer 111. The abovementioned surface treatment, such as a brushing treatment, laser treatment or plasma etching treatment can be performed to remove a portion of rough oxide layer to decrease the surface roughness of the surface 111s.

After the surface roughness of the wiring layer 111 is changed, a protective layer 140 can be formed on the wiring layer 111. At this time, a package carrier 311 including the supporting board 200, the wiring layer 111, the insulating pattern 131 stacked on and connected to the wiring layer 111, the bonding material 132 and protective layer 140 is basically completed. The material of the protective layer 140 may be the same as the bonding material 132. That is to say, the protective layer 140 can be a solder layer, metallic layer or organic solderability preservatives (OSP) layer. Notably, in the instant embodiment, the method of manufacturing the package carrier includes the steps of changing the surface roughness of the wiring layer 111 and forming the protective layer 140. However, in another embodiment, the abovementioned two steps can be omitted. In this case, the package carrier 311 may not include the protective layer 140.

Figure 3E:
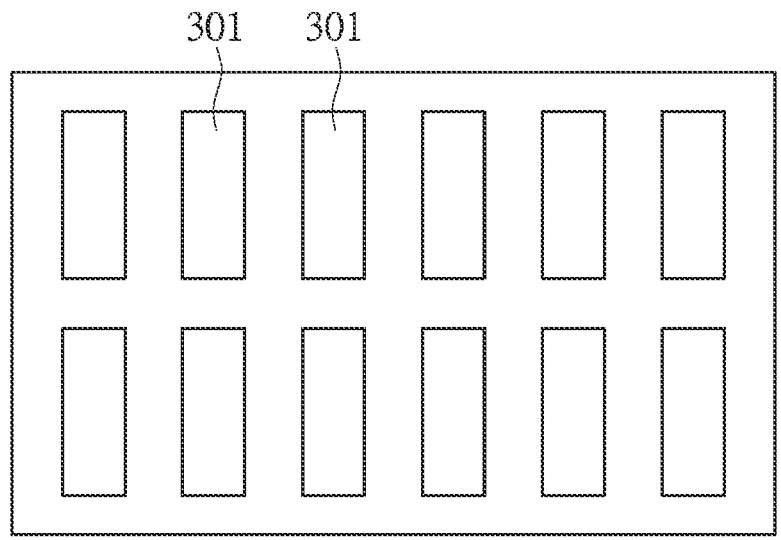

Please refer to FIG. 3E, which shows the top view of FIG. 3D. In the instant embodiment, a plurality of the package carriers 311 is directly formed on the working panel 300. To put it concretely, the working panel 300 includes a plurality of substrate strips 301, and each of the substrate strips 301 may include one or more package carriers 311. After the process shown in FIG. 3D is performed, a plurality of package carriers 311 can be formed on the substrate strips 301 during the same process. Please refer to FIG. 3D and FIG. 3E. Subsequently, the supporting board 200, the insulating pattern 131, and the wiring layer 111 are diced to divide the working panel 300 into a plurality of separated substrate strips 301.

Figure 4A:
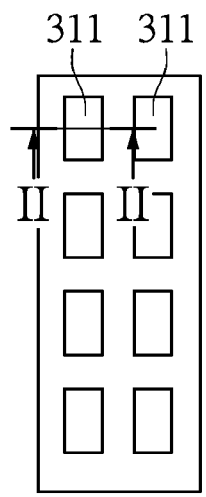
FIG. 4A to FIG. 4C respectively show sectional views of the electronic package in different steps of the manufacturing method provided in accordance with an embodiment of the present invention.
Figure 4B:
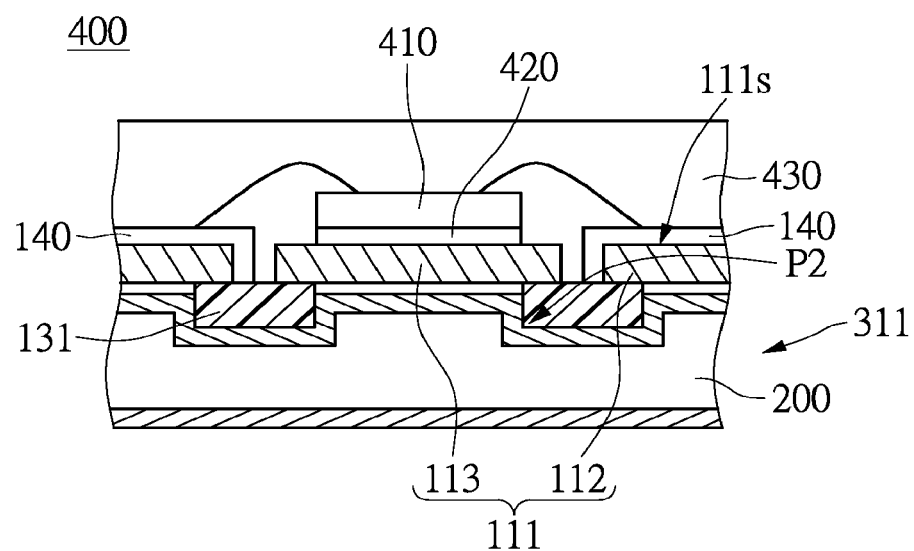
Figure 4C:
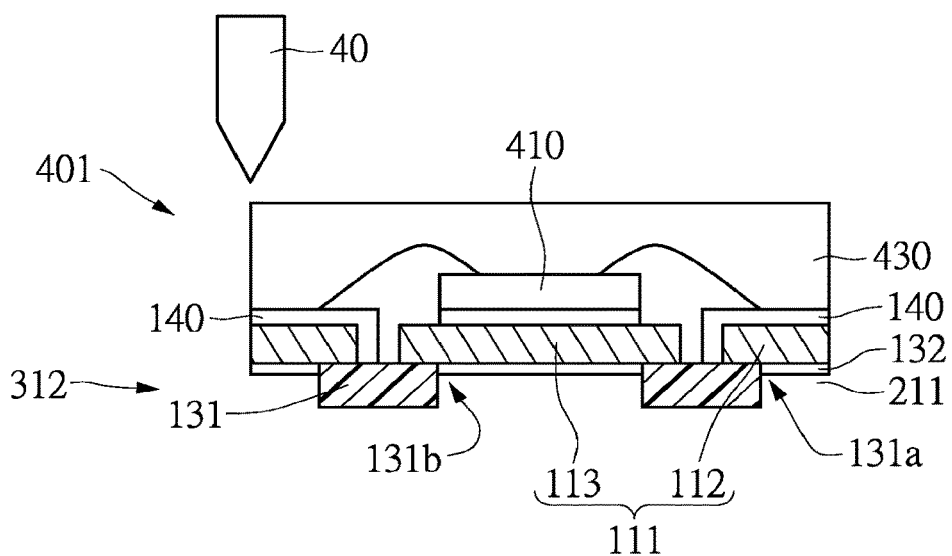

FIG. 4A to FIG. 4C respectively show sectional views of the electronic package in different steps of the manufacturing method provided in accordance with an embodiment of the present invention. Please refer to FIG. 4A and FIG. 4B. FIG. 4B is a sectional view taken along a line II-II in FIG. 4A. After the working panel 300 is diced to form the plurality of substrate strips 301, one or more electronic components 410 are mounted on one of the substrate strips 301. The electronic component 410 can be mounted on the substrate strip 301 by wire bonding or flip-chip bonding. The electronic component 410 can be a die or a discrete component. The electronic component 410 is mounted on the mounting pad 113, and the wiring layer 111 is interposed between the electronic component 410 and the insulating pattern 131.

Subsequently, a molding layer 430 covering the wiring layer 111 and the electronic component 410 is formed on the wiring layer 111. Furthermore, the molding layer 430 encapsulates the electronic component 410. At this time, the fabrication of an electronic package 400 including the package carrier 311, the electronic component 410 and the molding layer 430 is basically completed.

In the embodiment shown in FIG. 4B, the electronic component 410 is mounted on the substrate strip 301 by wire bonding, and attached on the mounting pad 113 by an adhesive layer 420. The adhesive layer 420 can be silver glue or polymer glue. When the adhesive layer 420 is silver glue, the adhesive layer 420 may diffuse due to the surface roughness of the mounting pad 113. However, because the surface roughness of the surface 111s of the wiring layer 111 can be changed by performing a surface treatment, the diffusion of the adhesive layer 420 can be attenuated. As such, the electronic component 410 can be firmly attached on the mounting pad 113. For similar reasons, the bonding force between the molding layer 430 and the wiring layer 111 is related to the surface roughness of the surface 111s. Accordingly, the bonding force between the molding layer 430 and the wiring layer 111 can be improved by performing the abovementioned surface treatment on the wiring layer 111 to prevent the molding layer 430 from dropping off.

Please refer to FIG. 4B and FIG. 4C. Subsequently, the insulating pattern 131 is detached from the depression pattern P2 to separate the supporting board 200 from the insulating pattern 131. Specifically, the connecting force between the supporting board 200 and the insulating pattern 131 is weaker or much less than that between the insulating pattern 131 and the wiring layer 111. The insulating pattern 131 is fitted in the depression pattern P2, and enough external force can be applied by hand or machine to the supporting board 200 to separate the supporting board 200 from the insulating pattern 131.

After the supporting board 200 and the insulating pattern 131 are separated from each other, the insulating pattern 131 is exposed. The opening 131a is aligned to the connecting pad 112, and the opening 131b is aligned to the mounting pad 113. In addition, the bonding material 132 exposed by the opening 131a can be used to connect the solder, such as tin balls, and the bonding material 132 exposed by the opening 131b can be used to connect the heat sink to assist in the heat dissipation of the electronic component 410. Thereafter, the substrate strip 301 (please refer to FIG. 4A) is diced by a cutting tool 40 to form the electronic package 401 and the package carrier 312 thereof without the supporting board 200.

Please refer to FIG. 5A to FIG. 5F. FIG. 5A to FIG. 5F respectively show sectional views of the package carrier in different steps of the manufacturing method provided in accordance with another embodiment of the present invention. Similar to the aforementioned embodiments, the method of manufacturing the package carrier includes the steps of providing the holding substrate 120 and conductive layer 110, which are described in the aforementioned embodiments, and forming the insulating pattern 131 and bonding material 132, as shown in FIG. 1C.

A difference between this embodiment and the previous embodiment is that the supporting board 200' provided in the instant embodiment includes a bonding layer 213. Specifically, the supporting board 200' of the instant embodiment is a composite board, which includes a plate 210, two metal layers 211 and 212, and a bonding layer 213. The two metal layers 211 and 212 are respectively laminated on two opposite sides of the plate 210, and the bonding layer 213 is formed on one (metal layer 211) of the metal layers 211 and 212.

The plate 210 has thermosetting property. That is, before the metal layer 211 is laminated with the plate 210, the plate 210 is a prepreg in semi-cured state. As such, while the metal layer 211 is being laminated on the plate 210, a thermal process is performed to cure the plate 210. As the previous embodiment mentioned, the metal layers 211 and 212 can be made of metal foil, such as cooper foil, silver foil or alloy foil. Additionally, in another embodiment, the plate 210 is laminated with only one metal layer 211, and the metal layer 212 or the other metal layers are omitted.

In another embodiment, the bonding layer 213 can be directly formed on the plate 210. In the instant embodiment, the plate 210 can be a ceramic plate, a metal plate, a plastic plate, or a composite plate without the multilayered structure. The plastic plate is, for example, a polymethacrylate plate, i.e., an acrylic plate. The metal plate can be made of a single metal material or an alloy material.

The bonding layer 213 can be a releasable adhesive, such as UV-curing adhesive, thermo-curing adhesive or metal adhesive tape. In another embodiment, the bonding layer 213 can be a reusable pressure sensitive adhesive, such as rubber-based pressure sensitive adhesive, acrylic-based pressure sensitive adhesive or silicone resin-based pressure sensitive adhesive. In addition, the bonding layer 213 may be made of silicone resin, rubber, polydimethylsiloxane (PDMS), polymethylmethacrylate (PMMA, or acrylic) or resin. Additionally, the bonding layer 213 can be formed by spraying, screen printing or directly attaching on the metal layer 211 or the plate 210.

Figure 5A:
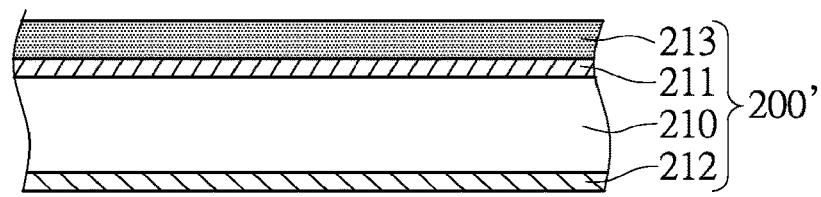
FIG. 5A to FIG. 5F respectively show sectional views of the package carrier in different steps of the manufacturing method provided in accordance with another embodiment of the present invention.
Figure 5B:
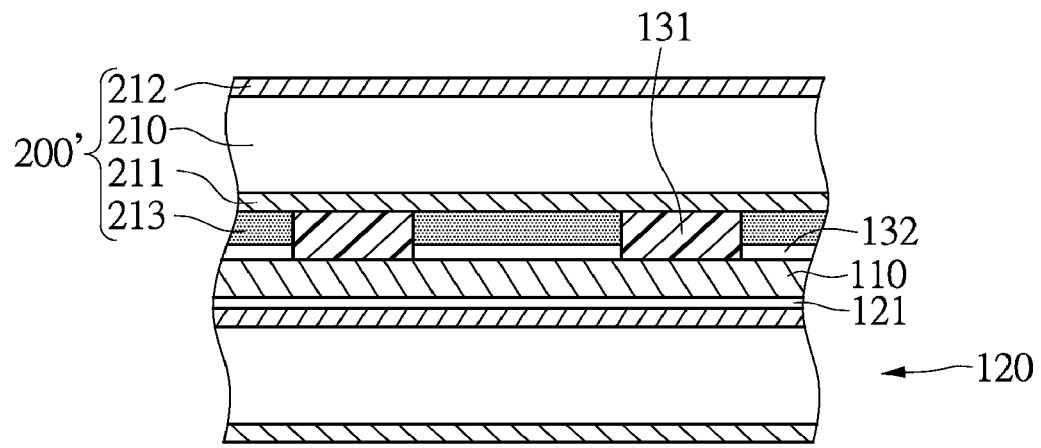

FIG. 5B to FIG. 5E show the method of manufacturing the wiring layer of the package carrier according to the instant embodiment. Please refer to FIG. 5B. The supporting board 200' shown in FIG. 5B is flipped in comparison with the supporting board 200' shown in FIG. 5A. After the formation of the supporting board 200', the insulating pattern 131 is fixed in the bonding layer 213 so that the conductive layer 110, the holding substrate 120, the insulating pattern 131 and the supporting board 200' are integrated into one.

In one embodiment, when the bonding layer 213 is formed on the metal layer 211 or the plate 210, the bonding layer 213 is in colloidal state. During the step of fixing the insulating pattern 131 in the bonding layer 213, the insulating pattern 131 is pressed into the bonding layer 213. In addition, after the step of pressing the insulating pattern 131 into the bonding layer 213, a curing process can be performed simultaneously to cure the bonding layer 213 so that the insulating pattern 131 is fixed in the bonding layer 213.

Notably, in the instant embodiment, an adhesion force between the insulating pattern 131 and the bonding layer 213 is weaker than that between the bonding layer 213 and the metal layer 211 (or the plate 210). Accordingly, the bonding layer 213 can be separable from the insulating pattern 131 without applying too much external force.

Figure 5C:
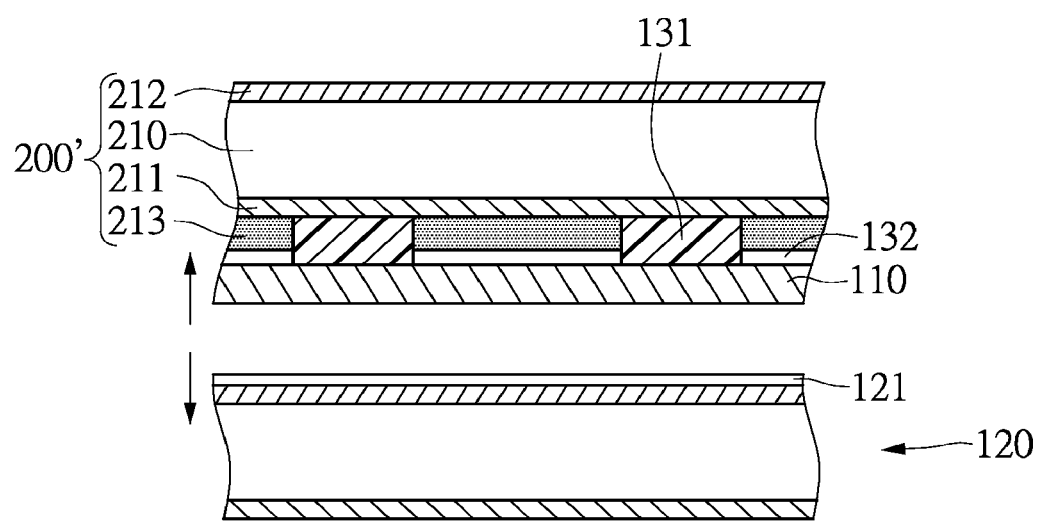

Please refer to FIG. 5C. After the insulating pattern 131 is pressed into the bonding layer 213, the holding substrate 120 is removed and the conductive layer 110 remains on the supporting board 200'. The means for removing the holding substrate 120 is similar to the previous embodiment shown in FIG. 3A and FIG. 3B, and omitted herein.

Figure 5D:
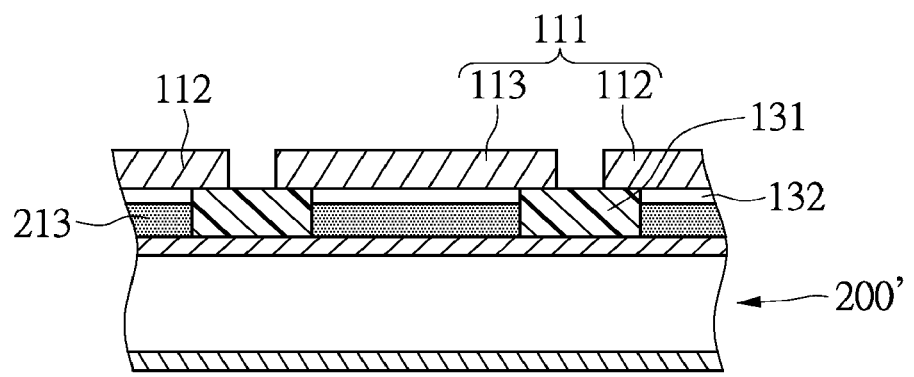
Figure 5E:
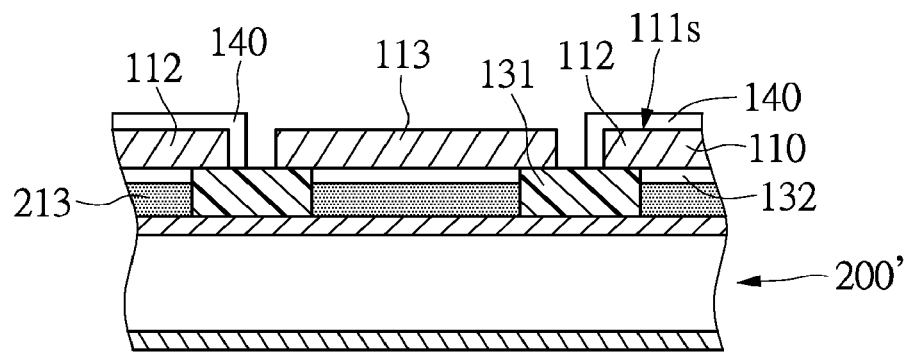

Please refer to FIG. 5D to FIG. 5E. Subsequently, the conductive layer 110 is patterned to form a wiring layer 111, which is followed by forming a protective layer 140. The methods for forming the wiring layer 111 and the protective layer 140 and the structures of the wiring layer 111 and the protective layer 140 are similar to the previous embodiment shown in FIG. 3B to FIG. 3D and the related contents, and omitted herein.

Figure 5F:
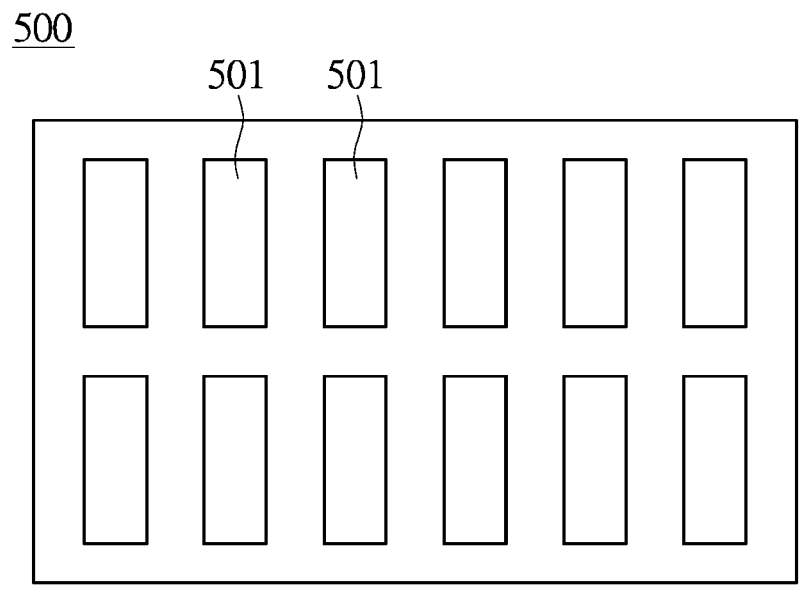

Please refer to FIG. 5F. FIG. 5F shows a top view of FIG. 5E. Similar to the aforementioned embodiments, after the process shown in FIG. 5E is completed, a plurality of package carriers 511 are directly formed on the working panel 500. To put it concretely, the working panel 500 includes a plurality of substrate strips 501, and each of the substrate strips 501 may include one or more package carriers 511. Subsequently, the supporting board 200', the insulating pattern 131, and the wiring layer 111 are diced to divide the working panel 500 into a plurality of separated substrate strips 501.

Figure 6A:
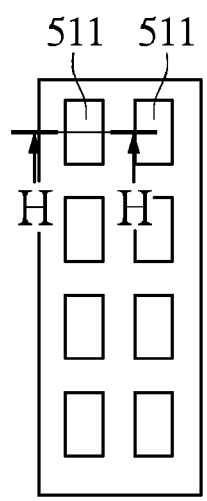
FIG. 6A to FIG. 6C respectively show sectional views of the electronic package in different steps of the manufacturing method provided in accordance with another embodiment of the present invention.
Figure 6B:
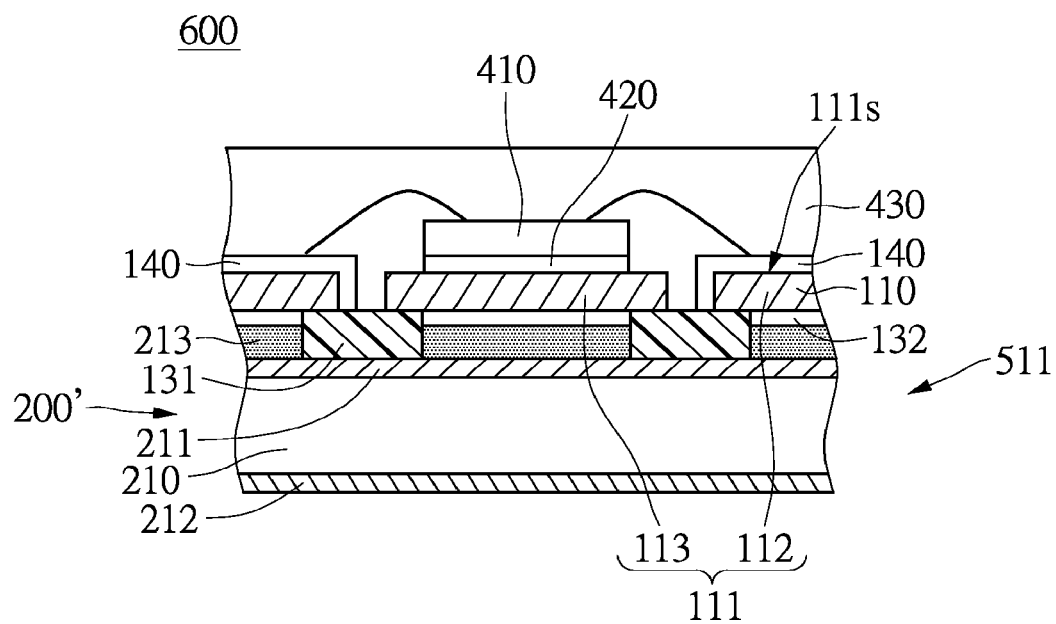
Figure 6C:
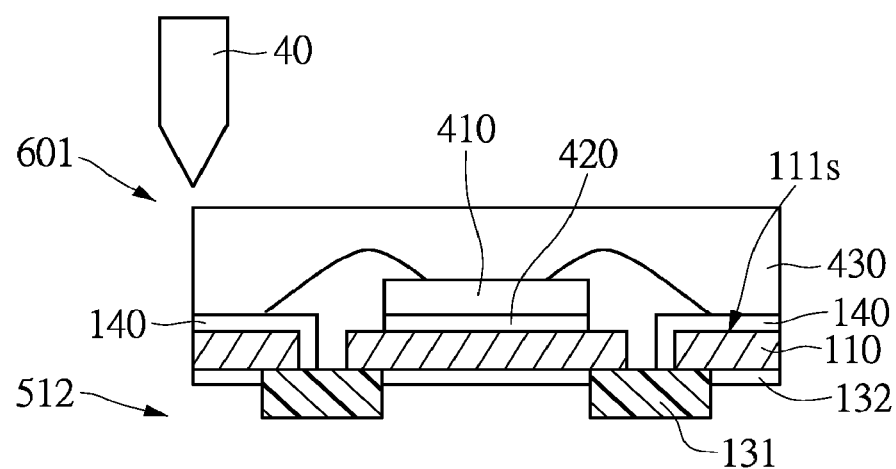

FIG. 6A to FIG. 6C respectively show sectional views of the electronic package in different steps of the manufacturing method provided in accordance with another embodiment of the present invention. Please refer to FIG. 6A and FIG. 6B. FIG. 6B is a sectional view taken along a line H-H in FIG. 6A. After the working panel 500 is diced to form the plurality of substrate strips 501, one or more electronic components 410 are mounted on one of the substrate strips 501. Subsequently, the molding layer 430 encapsulating the electronic component 410 is formed to form the electronic package 600. The steps of mounting the electronic component 410 on the substrate strip 501 and the details in the steps of encapsulating the electronic component 410 are similar to the previous embodiment, and the description thereof is omitted herein.

Please refer to FIG. 6B and FIG. 6C. Subsequently, the insulating pattern 131 is detached from the bonding layer 213 to separate the supporting board 200' from the insulating pattern 131. Specifically, the connecting force between the supporting board 200' and the insulating pattern 131 is weaker or much less than that between the insulating pattern 131 and the wiring layer 111. In addition, the adhesion force between the insulating pattern 131 and the bonding layer 213 is weaker than that between the bonding layer 213 and the metal layer 211 or the plate 210. Accordingly, after an enough external force is applied by hand or machine to the supporting board 200', the supporting board 200' can be separated from the insulating pattern 131. Subsequently, the substrate strip 501 (please refer to FIG. 6A) is diced by a cutting tool 40 to form the electronic package 601 and the package carrier 512 thereof without the supporting board 200'.

Notably, in another embodiment, each substrate strip 301 or 501 may be a package carrier 311 or 511. That is, the working panel 300 or 500 (please refer to FIG. 3E and FIG. 5F) can be diced to directly form a plurality of the package carriers 311 or 511 having a supporting board 200 or 200'. Accordingly, after the arrangement of the electronic component 410 and the formation of the molding layer 430 are completed, there is no need for dicing the substrate strips 301 or 501. In addition, the supporting board 200 or 200' can be kept so that the electronic package 401 or 601 can be delivered with the supporting board 200 and 200'.

In summary, compared with the conventional electronic package which has core layer, the electronic package 401 or 601 in the instant disclosure has a thinner thickness due to the omission of the supporting board 200 or 200'. Accordingly, the electronic package 401 or 601 can be well adapted to the thinning development trend of mobile devices, such as smart phones, tablets, personal digital assistants (PDA), laptops, handheld game consoles and so on, and the electronic package 401 or 601 can be implemented therein.

Additionally, after the plurality of the package carriers 311 or 511 are directly formed on the working panel 300 or 500, the package carriers 311 or 511 can be tested to determine whether the package carriers 311 or 511 are normal or abnormal. As such, the possibility of disposing the electronic component 410 on an abnormal package carrier 311 or 511 can be attenuated so as to improve the yield of the electronic package 400, 401, 600 or 601.

The descriptions illustrated supra set forth simply the preferred embodiments of the present invention; however, the characteristics of the present invention are by no means restricted thereto. All changes, alterations, or modifications conveniently considered by those skilled in the art are deemed to be encompassed within the scope of the present invention delineated by the following claims.

What is claimed is:

1. A package carrier, comprising:
   a wiring layer including at least one connecting pad and at least one mounting pad, wherein the mounting pad is used for disposing an electronic component, and the connecting pad is used for electrically connecting the electronic component;
   an insulating pattern stacked on and connected to the wiring layer, wherein a boundary surface is formed between the wiring layer and the insulating pattern, and both of the wiring layer and the insulating pattern do not extend over the boundary surface; and
   a supporting board having a depression pattern aligned to the insulating pattern, wherein the insulating pattern is detachably fixed and fitted in the depression pattern, thereby generating a fiction force for preventing the insulating pattern and the depression pattern from being separated from each other.

2. The package carrier according to claim 1, wherein the insulating pattern includes at least one opening aligned to the at least one connecting pad.

3. The package carrier according to claim 1, wherein the insulating pattern is a solder mask layer.

4. An electronic package, comprising:
   a package carrier comprising:
      a wiring layer including at least one connecting pad and at least one mounting pad; and
      an insulating pattern stacked on and connected to the wiring layer, wherein a boundary surface is formed between the wiring layer and the insulating pattern, and both of the wiring layer and the insulating pattern do not extend over the boundary surface;
      a supporting board having a depression pattern aligned to the insulating pattern, wherein the insulating pattern is detachably fixed and fitted in the depression pattern, thereby generating a friction force for preventing the insulating pattern and the depression pattern from being separated from each other;
   an electronic component disposed on the mounting pad and electrically connected to the at least one connecting pad, wherein the wiring layer is interposed between the electronic component and the insulating pattern; and
   a molding layer covering the wiring layer and the electronic component.

5. The electronic package according to claim 4, wherein the insulating pattern includes an opening aligned to the at least one connecting pad.

6. The electronic package according to claim 4, wherein the insulating pattern is a solder mask layer.

* * * * *